(12) United States Patent
Tsai et al.

(10) Patent No.: US 9,184,089 B2
(45) Date of Patent: Nov. 10, 2015

(54) MECHANISM OF FORMING A TRENCH STRUCTURE

(71) Applicant: Taiwan Semiconductor Manufacturing Company, Ltd., Hsin-Chu (TW)

(72) Inventors: Chun Hsiung Tsai, Xinpu Township (TW); Tsan-Chun Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/092,770

(22) Filed: Nov. 27, 2013

(65) Prior Publication Data

US 2015/0104923 A1    Apr. 16, 2015

Related U.S. Application Data

(60) Provisional application No. 61/889,376, filed on Oct. 10, 2013.

(51) Int. Cl.
*H01L 21/762* (2006.01)
*H01L 27/12* (2006.01)
*H01L 29/06* (2006.01)

(52) U.S. Cl.
CPC .... *H01L 21/76237* (2013.01); *H01L 21/76224* (2013.01); *H01L 27/1211* (2013.01); *H01L 29/0649* (2013.01)

(58) Field of Classification Search
USPC ......... 438/221–224, 296, 359–361, 424–438; 257/118, 244, 328–333, 466, 513, 594
See application file for complete search history.

(56) References Cited

U.S. PATENT DOCUMENTS

| 8,846,536 B2 | 9/2014 | Draeger et al. |
| 2007/0298585 A1* | 12/2007 | Lubomirsky et al. ......... 438/435 |
| 2014/0151760 A1 | 6/2014 | Wang et al. |

* cited by examiner

*Primary Examiner* — Mamadou Diallo
(74) *Attorney, Agent, or Firm* — Slater & Matsil, L.L.P.

(57) ABSTRACT

Embodiments of a mechanism for forming a shallow trench isolation (STI) structure filled with a flowable dielectric layer are provided. The mechanism involves using one or more low-temperature thermal anneal processes with oxygen sources and one or more microwave anneals to convert a flowable dielectric material to silicon oxide. The low-temperature thermal anneal processes with oxygen sources and the microwave anneals are performed at temperatures below the ranges that could cause significant dopant diffusion, which help dopant profile control for advanced manufacturing technologies. In some embodiments, an implant to generate passages in the upper portion of the flowable dielectric layer is also used in the mechanism.

21 Claims, 6 Drawing Sheets

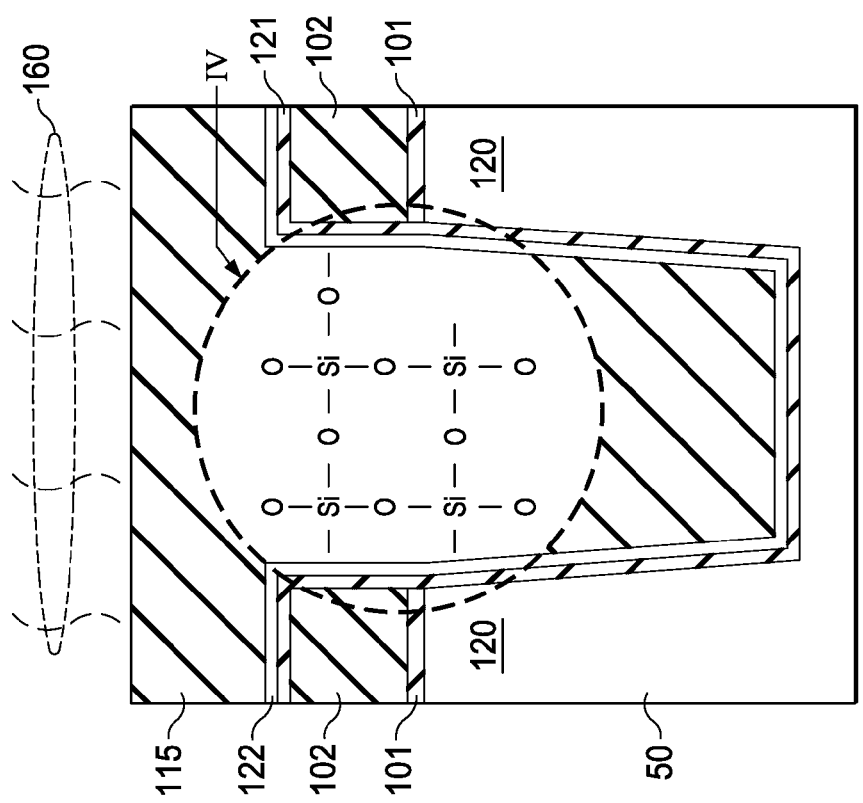
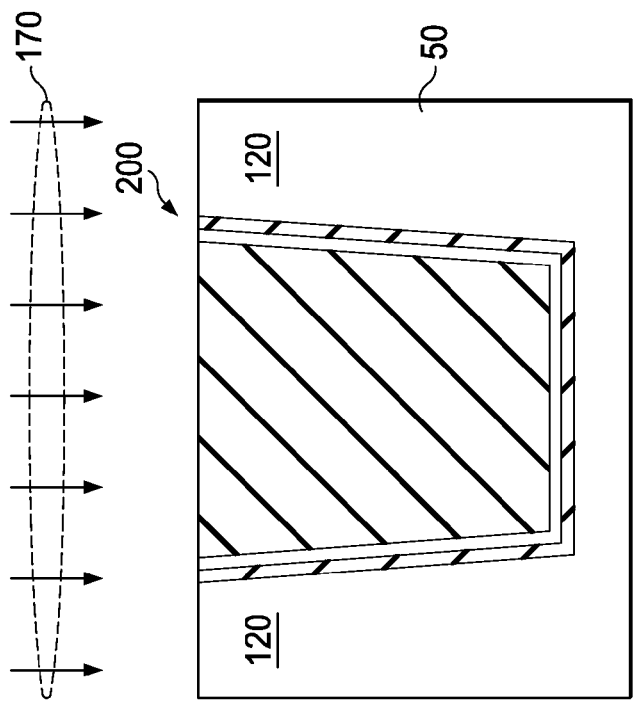
FIG. 1G
FIG. 1H

MECHANISM OF FORMING A TRENCH STRUCTURE

CROSS-REFERENCE TO RELATED APPLICATIONS

This application claims the benefit of U.S. Provisional Application No. 61/889,376, filed on Oct. 10, 2013, and entitled "Mechanism of Forming a Trench Structure." This application further relates to the following co-pending and commonly assigned U.S. patent application Ser. No. 14/046,384, filed on Oct. 4, 2013, and entitled "Mechanism for Forming a Trench Structure," which applications are incorporated herein by reference in their entirety.

BACKGROUND

Trench structures, such as shallow trench isolations (STIs), are used to separate and isolate active areas on a semiconductor wafer from each other. STIs are formed by etching trenches in a substrate, overfilling the trenches with a dielectric such as an oxide, and then removing any excess dielectric. STIs help to electrically isolate the active areas from one another.

However, as circuit densities continue to increase, the widths of trenches of STIs decrease, thereby increasing the aspect ratios of the STI trenches. Aspect ratio of a trench (or a gap) is defined as the trench height (or gap height) divided by the trench width (or gap width). It becomes very difficult to fill narrow and deep trenches completely with a gap-fill dielectric material for advanced technologies. Incomplete gap-filling results in unwanted voids and increases the risk of inclusion of unwanted defects when the unwanted voids are exposed during removal of excess dielectric. The voids may also result in inadequate isolation between active areas. The presence of voids in STI would affect yield.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

FIGS. 1A to 1J are cross-sectional views of a sequential process for forming a shallow trench isolation (STI) structure at various fabrication stages, in accordance with some embodiments.

DETAILED DESCRIPTION

Figure 1B:
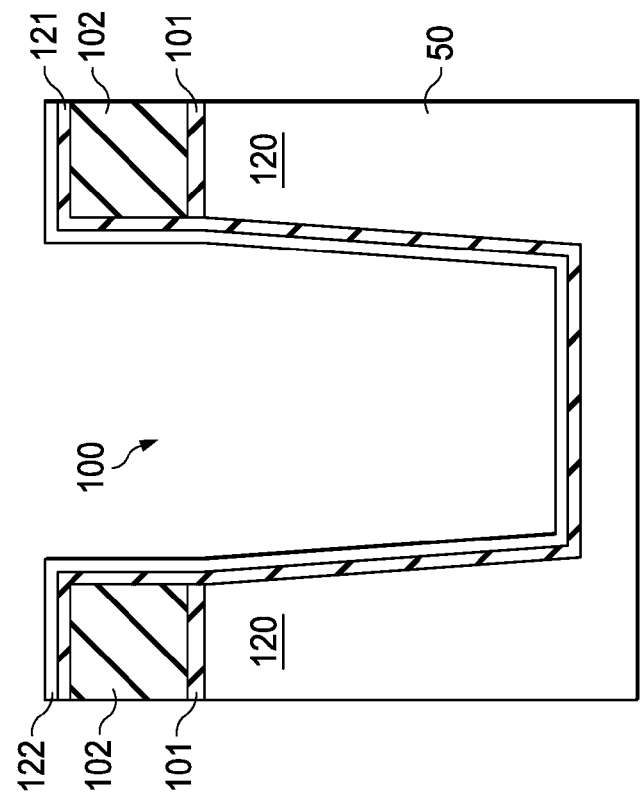

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As transistor sizes decrease, the sizes of various features associated with forming transistors also decrease. One such feature is the shallow trench isolation (STI) formed between active regions to provide isolation. Advanced semiconductor devices use epitaxial SiGe in the channel and source/drain regions. For future devices, the concentration of Ge in the epitaxial SiGe could increase to be mostly epitaxial Ge. As the concentration of Ge in epitaxial SiGe increases, the epitaxial channel relaxation temperature decreases. For example, the epitaxial channel relaxation temperature of SiGe with 50% Ge is about 1050° C. and about 600° C. for Ge (100% Ge). If Sn is incorporated in the channel material, the channel epitaxial relaxation temperature could possibly be lower than 600° C., such as less than about 500° C. To prevent channel epitaxial relaxation, which would alter channel properties, the processing temperature needs to be kept below the channel epitaxial relaxation temperature of the channel material.

In addition, manufacturing of advanced devices requires precise control of dopant concentrations in gate channel region, in source and drain regions, and in well regions. N-type dopants, such as phosphorus (P), arsenic (As), and p-type dopants, such as boron (B) diffuse significantly are temperature at about 700° C. or higher. Some advanced manufacturing processes could form dopant sources on the substrate before the STI structures are formed. In order to control the dopant profiles, it is desirable to have the processing temperatures for forming STI structures below dopant diffusion temperature(s).

As discussed above, the feature size reduction results in increased aspect ratios because the openings are smaller but not the depth of the STI. Techniques used to fill STIs having lower aspect ratios cannot be used to adequately fill STIs of advanced technologies having high aspect ratios. In many chemical vapor deposition (CVD) processes, plasma is used with silicon-containing precursors and oxygen-containing gas to form silicon oxide directly on the surface of the substrate. These plasma-based CVD processes form silicon oxide as deposited; however, they fill poorly for structures with high aspect ratios.

One alternative to improve filling pertains to using flowable dielectric materials instead of conventional silicon oxide as deposited. Flowable dielectric materials, as their name suggest, can "flow" during deposition to fill voids in a gap. Usually, various chemistries are added to the silicon-containing precursors to allow the deposited film to flow. In some embodiments, nitrogen hydride bonds are added. Examples of flowable dielectric precursors, particularly flowable silicon oxide precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silylamine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The curing and annealing may result in oxidation of the trench walls and widen the isolation regions. Further, the flowable film is cured and annealed more than once at high temperatures, such as in a range from about 1000° C. to about 1200° C., and for an extended period, such as 30 hours or more in total. The cure and anneals significantly reduce the thermal budget allowed for the rest of the semiconductor manufacturing process. Further, the high anneal temperatures with extended annealing cycles might not be acceptable for devices of advanced technologies. Therefore, there is a need to develop a different mechanism for forming STI structures.

Figure 1A:
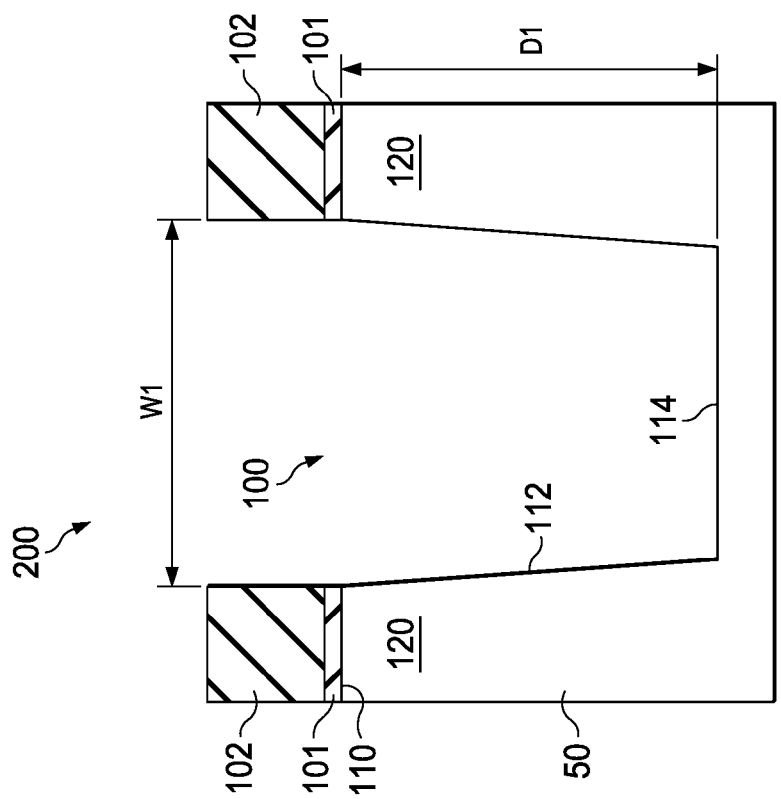

FIGS. 1A to 1J are cross-sectional views of various stages of forming a STI structure 200 in a substrate 50, in accordance with some embodiments. FIG. 1A shows a trench 100, which is formed in substrate 50. The trench formation includes multiple operations of patterning the substrate and etching the substrate. The substrate 50 may be bulk silicon, doped or undoped, or an active layer of a silicon on insulator (SOI) substrate. Generally, an SOI substrate includes an active layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

FIG. 1A also shows a patterned hard mask layer 102 and a protective layer 101 underneath formed over the top surface 110 of the substrate 50, in some embodiments. The protective layer 101 protects the surface 110 from direct contact with the hard mask layer 102. For example, if a portion of the substrate 50 next to trench 100, is made of silicon, the protective layer 101 protects active regions 120. The active regions 120 are used for forming devices (such as transistors, resistors, etc.) after the STI structure (200) are formed.

The demand for increased performance and shrinking geometry from ICs has brought the introduction of multi-gate devices. These multi-gate devices include multi-gate fin-type field-effect transistors, also referred to as finFETs, so called because the channel is formed on a "fin" that extends from the substrate. The active regions 120 could be fins of finFET devices. Depending upon the devices to be formed, the active regions 120 may comprise either channel regions, source and drain regions, and well (p-well and n-well) regions as determined by the design requirements.

The protective layer 101 is made of a thermal oxide, in some embodiments. The thickness of protective layer 101 is in a range from about 20 nm to about 100 nm. The hard mask layer 102 assists in maintaining the integrity of the patterns during etching of trench 100. In some embodiments, the hard mask layer 102 is used as a planarization stop layer during the removal of excess flowable dielectric film that fills trench 100. In some embodiments, the hard mask layer 102 is made of SiN. However, other materials, such as SiON, silicon carbide, or a combination thereof, may also be used. The thickness of hard mask layer 102 is in a range from about 200 nm to about 1200 nm. The hard mask layer 102 may be formed by a process such as chemical vapor deposition (CVD), plasma enhanced chemical vapor deposition (PECVD), or low pressure chemical vapor deposition (LPCVD). Alternatively, the hard mask layer 102 made be first made of a silicon oxide and then converted to SiN by nitridation. Once formed, the hard mask layer 102 and the protective layer 101 are patterned through suitable photolithographic and etching processes to form the openings over surface 110 for trench 100.

The exposed portions of the substrate 50 through the openings are removed by an etching process, such as reactive ion etching (RIE), in order to form the trench 100 in substrate 50. Trench 100 separates active regions 120 near the top surface 110 of the substrate 50. Trench 100 has sidewalls 112 and a bottom surface 114. In some embodiments, the trench 100 has a width $W_1$ in a range from about 20 nm to about 100 nm. In some embodiments, the trench 100 has a depth $D_1$ in a range from about 50 nm to about 350 nm.

An aspect ratio, the trench depth $D_1$ (sometimes referred to herein as trench height) divided by the trench width $W_1$, of trench 100 is greater than about 8 or greater than 10 in some embodiments.

Referring to FIG. 1B, a silicon oxide liner 121 and a silicon liner 122 are deposited sequentially to line trench 100, in accordance with some embodiments. The silicon oxide liner 121 and the silicon liner 122 are deposited on sidewalls 112 and bottom surface 114. In some embodiments, the silicon oxide liner 121 is thermally grown on the silicon walls of the trench 100. The substrate is exposed to an oxygen-containing environment at a high temperature and the surface exposed to the oxygen is converted to silicon oxide. In some embodiments, the oxygen-containing environment includes steam. The silicon oxide liner 121 may include an additional layer or layers over the thermally grown silicon oxide layer. In some embodiments, an additional silicon oxide layer may be deposited using plasma enhanced atomic layer deposition (PEALD). According to various embodiments, the silicon oxide liner 121 is formed to protect the silicon substrate 50 underlying the silicon oxide liner 121 from subsequent oxidation. A dense silicon oxide film such as a thermal oxide film is used to shield the underlying silicon substrate 50 from oxidation chemistry in subsequent processing. The silicon oxide liner 121 is relatively thin, in the order of tens to a hundred angstroms (Å), in order to minimize an increase in the aspect of the already high aspect-ratio trench to be filled. In some embodiments, the thickness of the silicon oxide liner 121 is in a range from about 2 nm to about 50 nm.

Referring to FIG. 1B, a silicon liner layer 122 is deposited over the silicon oxide liner 121. The silicon liner layer 122 provides stress relief during thermal anneal(s) of the flowable dielectric film (to be described below). In some embodiments, the silicon liner layer 122 is amorphous silicon or polysilicon. A thickness of the silicon liner layer 122 is in a range from about 10 Å to about 40 Å. The silicon liner layer 122 may be formed by using a furnace system in a gaseous environment containing $Si_2H_6$, $SiH_4$, $Si_3H_8$, $SiCl_2H_2$, $SiCl_3H$, or a combination thereof. In some embodiments, the flow rate of $Si_2H_6$ is in the range of about 10 standard cubic centimeters per minute (sccm) to about 1000 sccm. A temperature for the formation of the silicon liner layer 122 is in a range of about 200° C. to about 600° C., in some embodiments. A pressure range for the formation of the silicon liner layer 122 is from about 10 mTorr to about 10 Torr, in some embodiments. Alternatively, the silicon liner layer 122 may be formed by using a deposition technique that can form a conformal silicon layer, such as the low temperature chemical vapor deposition process (CVD) in a gaseous environment containing $Si_3H_8$, $SiH_4$, $SiCl_2H_2$, $SiCl_3H$, or a combination thereof.

In some embodiments, the gas environment also comprises a carrier gas such as $H_2$. The carrier gas helps to better control treatment uniformity. In some embodiments, the flow rates of $Si_3H_8$ and $H_2$ are in the range from about 10 standard cubic centimeters per minute (sccm) to about 1000 sccm, and from about 5 standard liters per minute (slm) to about 50 slm, respectively. A temperature for the formation of the silicon liner layer 122 in the chemical deposition process is in a range of about 250° C. to 550° C., in some embodiments.

Figure 1D:
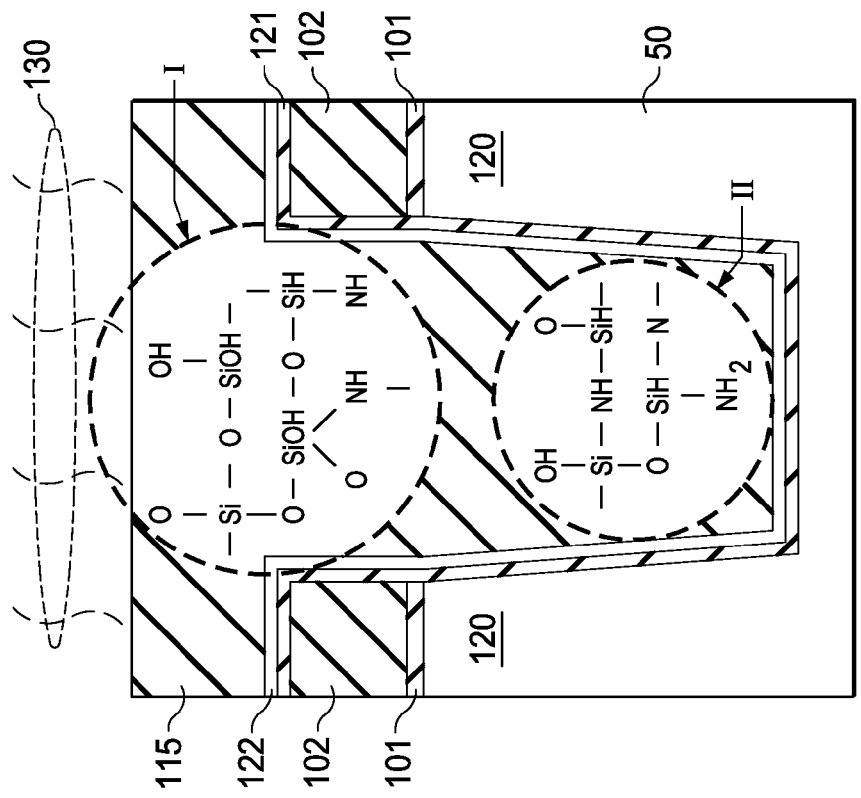
Figure 1C:
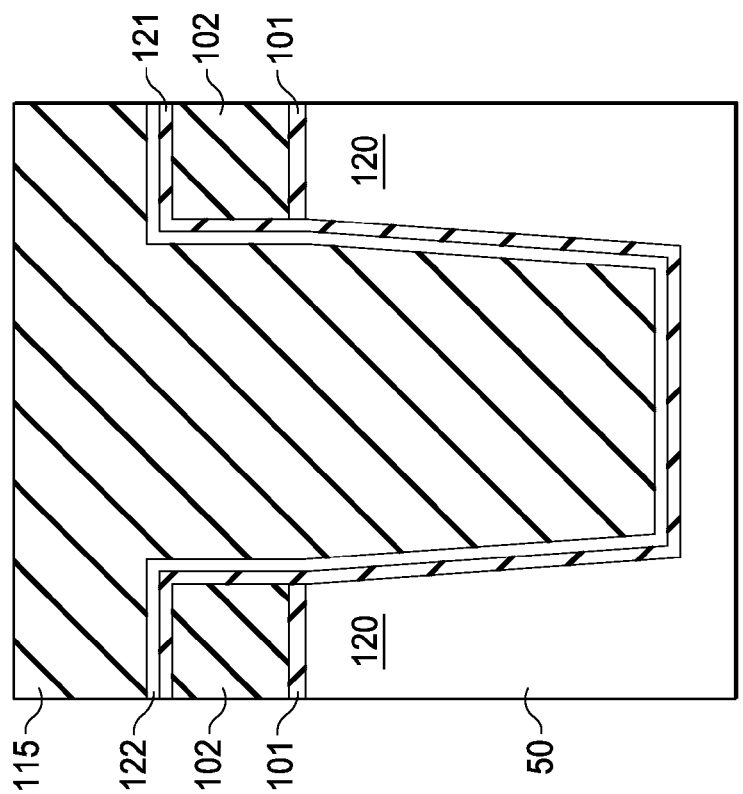

After the deposition of the silicon liner layer 122 and referring to FIG. 1C, a flowable dielectric material overfills the trench 100 and the hard mask layer 102 to form a flowable dielectric layer 115. The flowable dielectric layer 115 is formed by using a spin on dielectric (SOD) formation process, or by depositing a flowable dielectric by a chemical vapor deposition (CVD) process, such as radical-component CVD. The examples of flowable silicon oxide precursors include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA).

In some embodiments, the flowable dielectric layer 115 is deposited by using a silicon-containing precursor to react with another precursor, such as a "radical-nitrogen" precursor generated by a plasma. In some embodiments, the silicon-containing precursor is carbon-free and includes silyl-amines, such as $H_2N(SiH_3)$, $HN(SiH_3)_2$, $N(SiH_3)_3$, or a combination thereof. The silyl-amines may be mixed with additional gases that may act as carrier gases, reactive gases, or both. Examples of the additional gases may include $H_2$, $N_2$, $NH_3$, He, and Ar, among other gases. Silyl-amines may also be mixed with other carbon-free silicon-containing gas(es), such as silane ($SiH_4$) and disilane ($Si_2H_6$), hydrogen (e.g. $H_2$), and/or nitrogen (e.g. $N_2$, $NH_3$).

Nitrogen may be included in either or both of the radical precursor and the silicon-containing precursor. When nitrogen is present in the radical precursor, it may be referred to as a radical-nitrogen precursor. The radical-nitrogen precursor includes plasma effluents created by exciting a more stable nitrogen-containing precursor in plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture comprising a combination of $NH_3$, $N_2$, and $H_2$.

The radical-nitrogen precursor may also be accompanied by a carrier gas such as argon, helium, etc. Oxygen may be simultaneously delivered into the remote plasma region (in the form of $O_2$ and/or $O_3$) to adjust the amount of oxygen content in the radical-nitrogen precursor for forming the flowable dielectric layer 115 deposited with this technique.

The deposition of flowable dielectric layer 115 may proceed while the substrate temperature is maintained at a relatively low temperature. In some embodiments, the flowable dielectric layer 115 is deposited on the substrate surface at low temperature which is maintained by cooling the substrate during the deposition. In some embodiments, the deposition is performed at a temperature in a range from about −40° C. to about 200° C. In some embodiments, the deposition is performed at a temperature less than about 100° C.

In some embodiments, the deposition pressure is in a range from about 100 mTorr to about 10 Torr. In some embodiments, a reaction source uses a gaseous environment containing trisilylamine ($Si_3H_9N$, or TSA) and $NH_3$. In one embodiment, the flow rates of $Si_3H_9N$ and $NH_3$ are in the range of about 100 sccm to about 1000 sccm, and of about 100 sccm to about 2000 sccm, respectively. This particular dielectric film could be formed by an Alectrona® system, which is offered by Applied Materials of Santa Clara, Calif. Exemplary details of depositing flowable dielectric layer 115 by the radical-component CVD process mentioned above are described in U.S. Pat. No. 8,318,584.

The as-deposited flowable dielectric layer 115 is capable of filling the narrow and deep gaps and prevents voids and discontinuities in the STI structure 100. The as-deposited flowable dielectric layer 115 comprises a flowable network of $SiO_AN_BH_C$ (or SIONH), which has many dangling bonds (or defects). In some embodiments, A is a number in a range from about 0.8 to about 2, B is a number from about 0.01 to about 1, and C is a number from about 0.01 to about 1. In some embodiments, the thickness of flowable dielectric layer 115 above hard mask layer 122 is in a range from about 1000 Å to about 3000 Å.

After the flowable dielectric layer 115 is deposited, an in-situ curing process 130 is performed on the as-deposited flowable dielectric layer 115, as shown in FIG. 1D in accordance with some embodiments. In-situ means the curing process 130 is performed in the process chamber for depositing the flowable dielectric layer 115. In some embodiments, the curing process 130 is performed in a different chamber (or ex-situ).

In some embodiments, the curing process 130 is operated with $O_3$ (ozone) having a flow rate in the range of about 100 sccm to about 5000 sccm, or using steam with a flow rate in a range from about 100 sccm to about 5000 sccm. A temperature for the curing process 130 is in a rage of about 10° C. to about 500° C., in some embodiments. In some embodiments, steam is used during the curing process, instead of $O_3$. A pressure range for the curing process 130 is from about 1 Torr to about 760 Torr, in some embodiments. The duration of the curing process 130 is in a range from about 10 seconds to about 2 hrs, in accordance with some embodiments. The curing process 130 reduces or prevents the formation of particles, voids and variation of wet etch rate as a result of SiHx outgassing. Curing process 130 also increases the oxygen content of the as-deposited flowable dielectric layer 115, which is made of a network of $SiO_AN_BH_C$ (or SiONH), especially the portion of as deposited flowable dielectric layer 115 near the surface.

As mentioned above, the curing process 130 increases the oxygen content of the as-deposited flowable dielectric layer 115. The flowable dielectric layer 115 near the surface is exposed to the $O_3$ more than the bottom portion of trench 100. FIG. 1D shows an exemplary SiONH network (I) near the surface and another exemplary SiONH network (II) near the bottom of trench (100). The SiONH network near the surface contains more oxygen (or O) than the SiONH network near the bottom. The cured flowable dielectric layer 115 includes nitrogen hydride bonds and is less dense than a silicon oxide film.

In order to convert the SiONH network into a SiO (or $SiO_2$) network, additional thermal anneal(s) with oxygen source is needed. The SiONH network might need to be converted to a network with SiOH and SiO before being fully converted to a SiO (or $SiO_2$) network. A surface dielectric layer containing mostly a SiO network would form on the surface due to its close proximity to the oxygen source when an anneal is applied with oxygen source, such as steam or $H_2O_2$. If the anneal temperature is high, such as greater than 600° C., the surface dielectric layer containing mostly of SiO network would form very quickly.

Such a surface dielectric layer on the surface of flowable dielectric layer 115 would block the oxygen source from penetrating or diffusing through the dense top layer to reach the less-converted SiONH network underneath. Even without the surface dielectric layer, the oxygen source needs to diffuse through a surface portion of flowable dielectric layer 115 to reach the bottom portion of flowable dielectric layer. The diffusion would take time. As a result, the conversion of the SiONH network into a SiO (or SiO2) network could occur very slowly for manufacturing purpose. It is more desirable to convert the SiONH network into a SiOH and SiO network throughout the entire film depth of flowable dielectric layer 115 first.

Figure 1F:
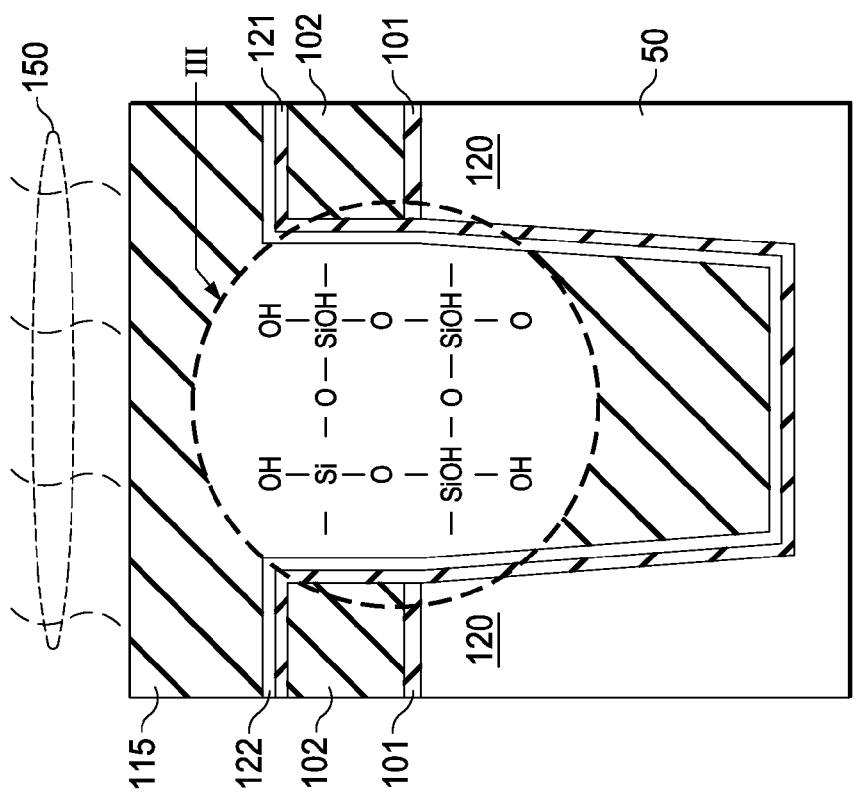
Figure 1E:
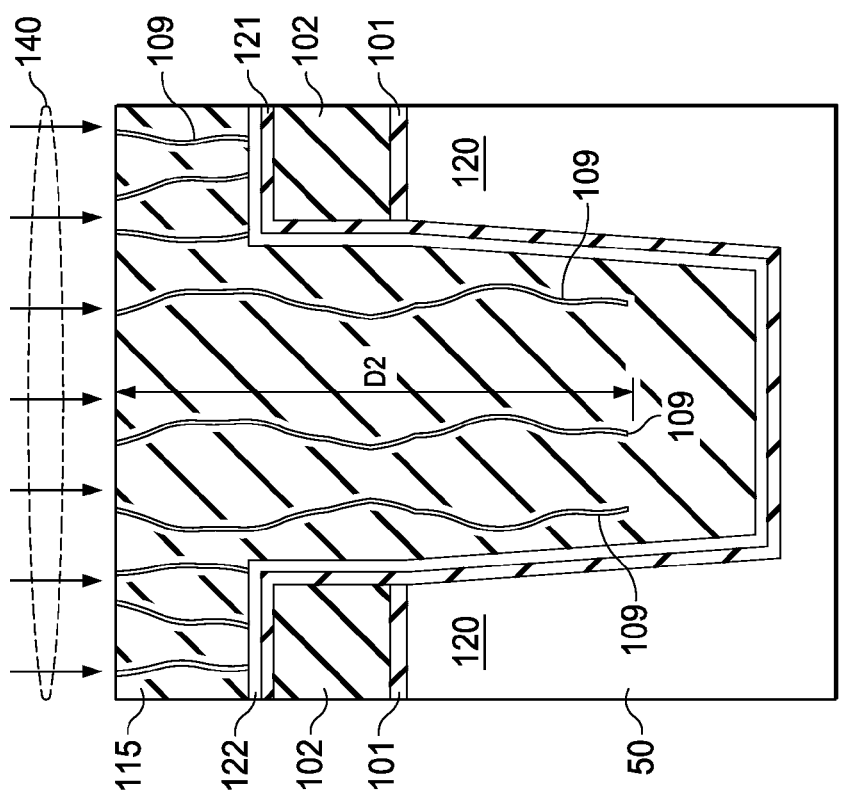

In order to solve the problem of forming a surface dielectric layer with mostly SiO network, an implant process 140 is conducted to create passages for the oxygen-source to reach the SiONH network below the surface, as shown in FIG. 1E in accordance with some embodiments. The implanted element(s) may include H, He, Si, O, or N. Portions of substrate 50 are not covered by hard layer 102 and are not STI structures. During the implant process 140, these portions of substrate 50 are exposed to the implant sources. H and He atoms are smaller and would not cause damage on such portions of un-covered silicon substrate 50. In contrast, Si, O, and N atoms are heavier and could cause damages of the exposed silicon substrate 50. If one of them is chosen as an implant source, a protective mask, such as a photoresist layer, could be needed.

The implant process creates minute passages (or channels) 109 in the surface portion of cured flowable dielectric layer 115, as shown in FIG. 1E in accordance with some embodiments. The passages 109 allow the oxygen-source of the subsequent thermal anneal to reach the SIONH near the bottom of trench 100. The passages 109 also allow the by-products of thermal anneal(s) to escape from the flowable dielectric layer 115 to reach the ambient. In some embodiments, however, the implant process 140 is optional and it can be omitted in some embodiments.

In some embodiments, H or He is used as an implant element and the implant energy is in a range from about 6 keV to about 25 keV. The implant depth $D_2$ is in a range from about 1000 Å to about 2500 Å, in some embodiments. The implant concentration is in a range from about 1E13 atoms/cm$^3$ to about 5E15 atoms/cm$^3$ in some embodiments. In some embodiments, a ratio R of implant depth $D_2$ to the depth $D_1$ of the trench is at least 1/3. In some embodiments, the ratio R is in a range from about 1/3 to about 2/3. In some embodiments, the ratio R is in a range from about 1/3 to about 1/2. More details of the implant process 140 are provided in U.S. patent application Ser. No. 14/046,384, filed on Oct. 4, 2013, entitled "Mechanism for Forming a Trench Structure," which is incorporated herein by reference in its entirety.

However, if the subsequent anneal temperature(s) is low, the formation of the surface dielectric layer with mostly SiO network would be slowed. Therefore, in some embodiments, the implant process 140 is omitted.

After the curing process 130 or implant process 140 (if it is applied), a low-temperature thermal anneal 150 is performed to convert the SiONH network into a SiOH+SiO network, as shown in FIG. 1F in accordance with some embodiments. The low-temperature thermal anneal 150 can be conducted at a temperature in a range from about 200° C. to about 400° C., in some embodiments. It is called a "low-temperature" thermal anneal to differentiate from a known thermal anneal for dielectric layer of STI, which occurs at about 1000° C. or higher. The low process temperature of thermal anneal 150 does not cause rapid conversion of top surface layer to an oxide layer and provides sufficient time for oxygen source to penetrate to the bottom portion of flowable dielectric layer 115. In addition, the anneal temperature of the low-temperature thermal anneal 150 does not cause dopant diffusion, which is important for advanced semiconductor manufacturing as described above.

An oxygen source, such as steam ($H_2O$) or $H_2O_2$, can be provided to assist the conversion of the SiONH network into SiOH+SiO network. Due to the relatively low process temperature, the oxygen source has sufficient time to penetrate into the flowable dielectric layer 115 to reach the portion of layer away from the surface. FIG. 1F shows an exemplary SiOH+SiO network (III) in flowable dielectric layer 115 at the end of stream thermal anneal process 150.

Figure 2:
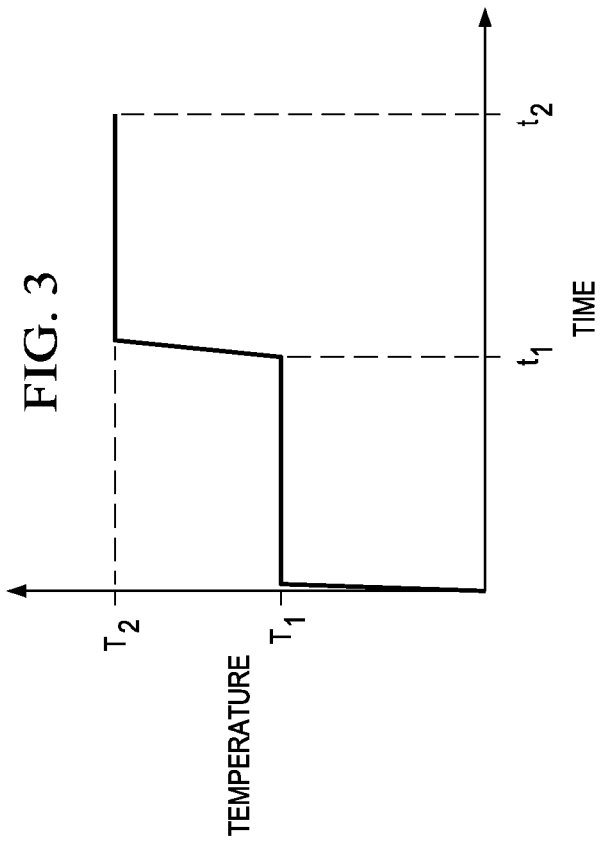
FIG. 2 is a thermal annealing temperature profile, in accordance with some embodiments.

The low-temperature anneal process 150 is performed in a furnace, in some embodiments. The process duration is in a range from about 30 minutes to about 1 hour at a temperature T in a range from about 500° C. to about 600° C., in some embodiments. FIG. 2 shows a substantially isothermal process described above, in accordance with some embodiments.

Figure 3:
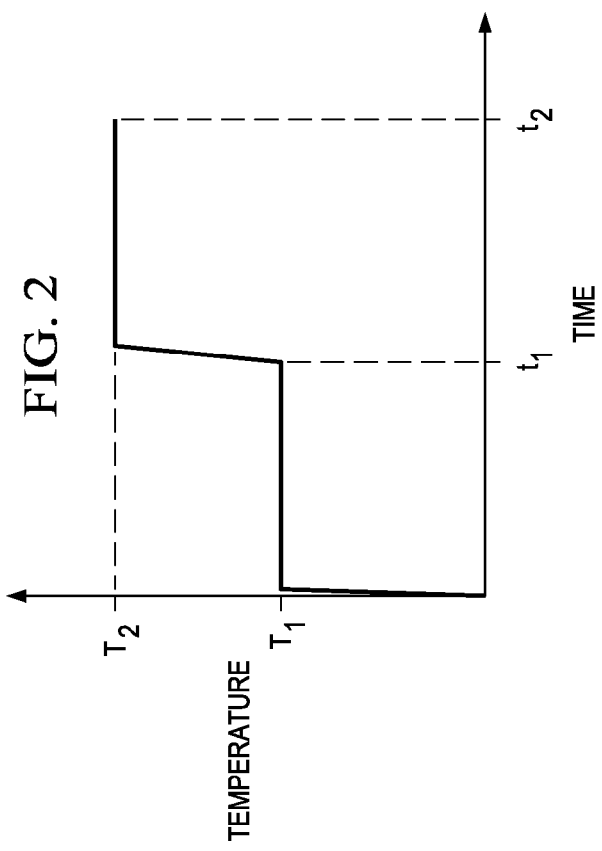
FIG. 3 is a thermal annealing temperature profile, in accordance with some embodiments.

In some embodiments, the low-temperature thermal anneal process is not an isothermal process. For example, the process temperature is set at a first temperature ($T_1$), such as 200° C., for a period ($t_1$) followed by a second temperature ($T_2$), such as 550° C., for another period ($t_2$-$t_1$), as shown in FIG. 3 in accordance with some embodiments.

Setting the initial temperature $T_1$ at a lower value could allow the oxygen source to penetrate through the flowable dielectric layer 115 to reach portions away from the surface (or deeper portions). Different variations the embodiments described in FIGS. 2 and 3 are also possible. For example, the temperature of substrate 50 does not need to be constant at $T_1$ from time 0 to time $t_1$. Temperature of substrate 50 can increase from a lower temperature to reach $T_1$. Similarly, the temperature of substrate 50 does not need to be constant at $T_2$ from $t_1$ to $t_2$. Temperature of substrate 50 can increase from $T_1$ to reach $T_2$. After the oxygen source reaches the deeper portions, the process temperature is raised to a higher value to speed up the conversion of SiONH network to a SiOH+SiO network. In some embodiments, $t_1$ is in a range from about 30 minutes to about 1 hour. In some embodiments, $t_2$-$t_1$ (or the duration of processing under $T_2$) is in a range from about 30 minutes to about 1 hour.

If the implant process 140 described above is performed, the oxygen source, such as steam ($H_2O$) or $H_2O_2$, penetrates through the passages 109 created by the implant to reach SIONH network and to convert the SiONH network to SiOH+SiO network. The by-products of the conversion, such as $NH_3$, $N_2$, $N_2O$, etc, also can reach the surface of the flowable dielectric layer 115 via passages 109. The implant process 140 can cut down the process time by a percentage in a range from about 20% to about 40%.

Both curing process 130 and steam thermal anneal process 150 causes flowable dielectric layer 115 to expand. The duration and temperature of curing process 130 and the steam thermal anneal process 150 affect the amount of volume change. In some embodiments, the volume of the flowable dielectric layer 115 expands in a range from about 1 to about 5% after the curing process 130. In some embodiments, the volume of the flowable dielectric layer 115 expands in a range from about 3 to about 10% after the thermal anneal process 150.

After the steam thermal anneal process described above, a "dry" (without steam) thermal anneal process 160 is conducted to convert the SiOH and SiO network into SiO (or SiO2) network, as shown in FIG. 1G in accordance with some embodiments. During the dry thermal anneal process 160, steam is not used. In some embodiments, an inert gas, such as N2, is used during the dry thermal anneal process 160. As mentioned above, high anneal temperature could result in channel epitaxial relaxation or dislocation for advanced channel materials (e.g. greater than 750° C. for advanced SiGe) and/or result in un-desirable dopant diffusion (greater than about 750° C.) for advanced device manufacturing. To avoid such issues, annealing temperature(s) needs to be kept lower than the limits and possibly with a buffer.

In order to achieve the annealing purpose with an annealing temperature less than the lower dopant diffusion temperatures for both n-type and p-type dopants, a microwave annealing (MWA) process 160 is used, as shown in FIG. 1G in accordance with some embodiments. MWA process 160 utilizes the dipoles in the SiONH network with defects (or dangling bonds), especially the dipoles of the SiOH bonds, in the cured flowable dielectric layer 115 to locally increase the anneal temperature of the flowable dielectric layer 115 to convert the SiOH+SiO network into SiO network.

As shown above in FIG. 1F, flowable dielectric layer 115 includes SiOH+SiO network throughout the film. The dipoles in the SiOH bonds throughout the film (from surface to bottom) could be used for increase the temperature of flowable dielectric layer 115. Since microwave can penetrate through the flowable dielectric layer 115, it can effectively interact with dipoles and anneal the entire flowable dielectric layer 115, including the bottom portions of the flowable dielectric layer 115. As a result, MWA process 160 could be effective in annealing the entire flowable dielectric layer 115.

MWA may rely on a few polarization mechanisms. For the annealing of the flowable dielectric layer 115 described here, MWA process 160 relies on dipolar polarization in the flowable dielectric layer 115. The various layers/structures that surround or are beneath the flowable dielectric layer 115 do not have dipoles with polarities as strong as the flowable dielectric layer 115. As a result, the temperature of the flowable dielectric layer 115 may be raised higher than other layers and structures. For example, when the temperature of substrate 50 is at about 500° C., the temperature of the flowable dielectric layer 115 may be at about 1000° C. or higher.

MWA process 160 process can be optimized to fully utilize dipolar polarization in the flowable dielectric layer 115 to increase its temperature to anneal temperature the flowable dielectric layer 115, such as about 1000° C. or higher. In some embodiments, the frequency of the MWA process 160 is in a range from about 2 GHz to about 10 GHz. In some embodiments, the frequency of the MWA process 160 is in a range from about 5 GHz to about 6 GHz. In some embodiments, the power of the MWA process 160 is in a range from about 5000 watts to about 10000 watts. The temperature of the substrate 50 is in a range from about 400° C. to about 600° C. The duration of the MWA process 160 is in a range from about 30 seconds to about 1200 seconds. Under the described anneal temperature range, there is no risk of dopant diffusion. Therefore, the anneal by MWA process 160 with the process conditions described above is called a diffusionless anneal.

The dry anneal process 160 converts the network of SiOH and SiO in the flowable dielectric layer 115 to a network of SiO (or $SiO_2$). However, since anneal by-products, such as $H_2$, etc., from dry anneal process 160 are relatively small, they can escape through the flowable dielectric layer 115. FIG. 1G shows an exemplary SiO network (IV) in flowable dielectric layer 115 at the end of dry anneal process 160.

The dry thermal anneal process 160 may also cause flowable dielectric layer 115 to shrink further. The duration and temperature of the dry thermal anneal process 160 affect the amount of shrinkage.

The steam and dry anneals also convert the silicon liner layer 122 around the cured flowable dielectric layer 115 into a silicon oxide layer. No voids or low density regions form in the bottom portion of the STI structure as result of the conversion and densification of the cured flowable dielectric layer 115.

Dry thermal anneal process 160 causes flowable dielectric layer 115 to shrink. In some embodiments, the volume of the flowable dielectric layer 115 shrinks in a range from about 10% to about 20%. The duration and temperature of the anneal process (160) could affect the amount of shrinking.

After the dry thermal anneal process, the flowable dielectric layer 115 is converted to $SiO_2$. A planarization process 170 is performed to remove flowable dielectric layer 115 outside trench (100), as shown in FIG. 1H in accordance with some embodiments. In some embodiments, the planarization process 170 is a chemical-mechanical polishing (CMP) process. The planarization process 170 removes the flowable dielectric layer 115 outside trench 100, in some embodiments. In some embodiments, the planarization process 170 also removes the hard mask layer 102 and the protective layer 101. In some other embodiments, the planarization process 170 removes the hard mask layer 102; however, the protective layer 101 is removed by a separate etching process.

After the excess flowable dielectric layer 115 outside the trench (100), the hard mask layer 102, and the protective layer 101 are removed, the STI structure 200 is formed, in some embodiments.

However, in some embodiments, there are residual SiOH bonds or network in the flowable dielectric layer 115 after the planarization process 170 is completed. The steam anneal process 150 and the MWA process 160 described might not have converted the entire flowable dielectric layer 115 into SiO network (or $SiO_2$ film). For example, if the implant process 140 is omitted, the steam anneal process 150 and the MWA process 160 might not be able to convert the entire flowable dielectric layer 115 into $SiO_2$. When this occurs, another low-temperature steam anneal similar to steam anneal process 150 and another MWA process similar to MWA 160 could be used to complete the conversion (to SiO2).

Figure 1J:
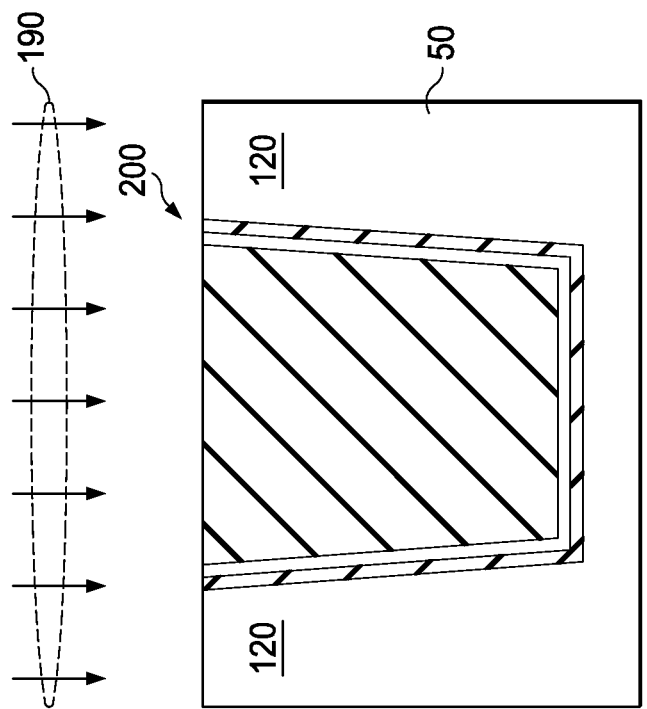
Figure 1I:
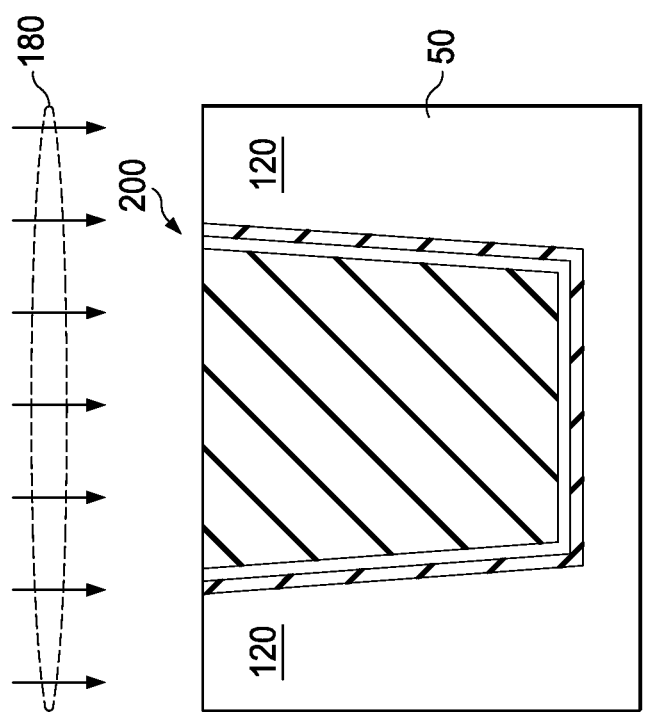

FIG. 1I shows substrate 50 with an STI 200 undergoes a steam anneal process 180, in accordance with some embodiments. Steam anneal process 180 is similar to steam anneal process 150 described above. Steam anneal 180 converts any residual SiONH network to SiOH and SiO network. FIG. 1J shows substrate 50 with an STI 200 undergoes an MWA process 190, in accordance with some embodiments. The MWA process 190 process is similar to MWA process 160 described above. MWA process 190 converts SiOH bonds to SiO bonds. At the end of MWA process 190, STI structure 200 is filled with $SiO_2$. However, if the steam anneal process 150 and dry MWA process 160 process are able to complete the $SiO_2$ conversion, steam anneal 180 and MWA process 190 are not needed.

While the above embodiments have been described with reference to using implant to create passages for the oxygen-source to reach the SIONH network below the surface, other mechanisms for creating passages may also be used. For example, plasma treatment or laser beams may also be used to create similar passages.

By using low-temperature steam anneal process(es) 150, and possibly 180, and MWA process(es) 160, and possibly MWA process 190, the formation process sequence of STI structure 200 is filled with a flowable dielectric material with good gap fill (without voids) and full $SiO_2$ conversion. In addition, the processing temperatures of the STI formation sequence are all under 750° C. and do not cause dopant diffusion, which are compatible with advanced manufacturing technologies.

Embodiments of a mechanism for forming a shallow trench isolation (STI) structure filled with a flowable dielectric layer are provided. The mechanism involves using one or more low-temperature thermal anneal processes with oxygen sources and one or more microwave anneals to convert a flowable dielectric material to silicon oxide. The low-temperature thermal anneal processes with oxygen sources and the microwave anneals are performed at temperatures below the ranges that could cause significant dopant diffusion, which help dopant profile control for advanced manufacturing technologies. In some embodiments, an implant to generate passages in the upper portion of the flowable dielectric layer is also used in the mechanism.

In some embodiments, a method of forming a semiconductor structure is provided. The method includes depositing a flowable dielectric layer in a trench of a substrate, and performing a first thermal anneal with an oxygen source. The method also includes performing a second thermal anneal by microwave anneal (MWA). The method further includes performing a planarization process to remove excess flowable dielectric layer outside the trench.

In some other embodiments, a method of forming a shallow trench isolation (STI) structure in a substrate is provided. The method includes depositing a flowable dielectric layer in a trench of the substrate by a chemical vapor deposition (CVD) process. The flowable dielectric layer fills the trench without forming a void. The method also includes curing the deposited flowable dielectric layer with $O_3$, and performing an implant process on the flowable dielectric layer. The implant process generates passages in a top portion of the flowable dielectric layer. The method further includes performing a first thermal anneal with an oxygen source, and performing a second thermal anneal by microwave anneal (MWA). In addition, the method includes performing a planarization process to remove excess flowable dielectric layer outside the trench.

In yet some other embodiments, a method of forming a shallow trench isolation (STI) structure in a substrate is provided. The method includes depositing a flowable dielectric layer in a trench of the substrate. The trench has an aspect ratio greater than about 8, and the flowable dielectric layer fills the trench without forming a void. The method also includes performing an implant process on the flowable dielectric layer, and performing a first thermal anneal with an oxygen source. The method further includes performing a second thermal anneal by microwave anneal (MWA), and performing a planarization process to remove excess flowable dielectric layer outside the trench.

While the above embodiments have been described with reference to shallow trench isolation, one skilled in the art will appreciate that the present disclosure could apply to various other structures in which it is desirable to fill a trench or gap, particularly a trench or gap having a high aspect ratio, with a good quality dielectric.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure comprising:
   depositing a flowable dielectric layer in a trench of a substrate;
   creating passages in the flowable dielectric layer;
   performing a first thermal anneal with an oxygen source;
   performing a second thermal anneal by microwave anneal (MWA); and
   performing a planarization process to remove excess flowable dielectric layer outside the trench.

2. The method of claim 1, wherein creating passages in the flowable dielectric layer further comprises:
   performing a process on the flowable dielectric layer prior to performing the first thermal anneal with an oxygen source, wherein the process comprises at least one of an implant process, a plasma treatment process, and a laser beam process.

3. The method of claim 2, further comprising:
   performing an $O_3$ cure after the flowable dielectric layer is deposited and before the process is performed.

4. The method of claim 2, wherein the process comprises the implant process, and wherein the implant process implants at least one of H atoms and He atoms.

5. The method of claim 1, wherein an anneal temperature of the first thermal anneal is in a range from about 200° C. to about 400° C.

6. The method of claim 1, wherein the oxygen source is steam or $H_2O_2$.

7. The method of claim 1, wherein the second thermal anneal by MWA is in a range from about 400° C. to about 600° C.

8. The method of claim 1, wherein a frequency of the second thermal anneal by MWA is performed in a range from about 2 GHz to about 10 GHz.

9. The method of claim 1, wherein the second thermal anneal by MWA is performed in a range from about 5000 watts to about 10000 watts.

10. The method of claim 1, wherein the second thermal anneal by MWA is performed for a duration in a range from about 30 seconds to about 1200 seconds.

11. The method of claim 1, further comprising:
    performing a third thermal anneal with an oxygen source after the planarization process; and
    performing a fourth thermal anneal by microwave anneal (MWA).

12. The method of claim 2, wherein the process comprises the implant process, and wherein an implant depth of the implant process is in a range from about 1000 Å to about 2500 Å.

13. The method of claim 2, wherein the process comprises the implant process, and wherein an implant energy is in a range from about 6 keV to about 25 keV.

14. The method of claim 2, wherein the process comprises the implant process, and wherein a ratio of an implant depth to a depth of the trench is in a range from about 1/3 to about 1/2.

15. The method of claim 1, wherein an anneal time of the first thermal anneal is in a range from about 30 minutes to about 1 hour.

16. The method of claim 1, wherein the as-deposited flowable dielectric layer includes a network of SiONH, and wherein the first thermal anneal and the second thermal anneal convert the as-deposited flowable dielectric layer into silicon dioxide ($SiO_2$).

17. A method of forming a shallow trench isolation (STI) structure in a substrate; comprising:
    depositing a flowable dielectric layer in a trench of the substrate by a chemical vapor deposition (CVD) process;
    curing the deposited flowable dielectric layer with an oxygen source;
    performing an implant process on the flowable dielectric layer, wherein the implant process generates passages in a top portion of the flowable dielectric layer;
    performing a first thermal anneal with an oxygen source;
    performing a second thermal anneal by microwave anneal (MWA); and
    performing a planarization process to remove excess flowable dielectric layer outside the trench.

18. The method of claim 17, wherein an anneal temperature of the first thermal anneal is in a range from about 200° C. to about 400° C.

19. A method of forming a shallow trench isolation (STI) structure in a substrate; comprising:
- depositing a flowable dielectric layer in a trench of the substrate, wherein the trench has an aspect ratio greater than about 8;
- performing an implant process on the flowable dielectric layer;
- performing a first thermal anneal with an oxygen source;
- performing a second thermal anneal by microwave anneal (MWA); and
- performing a planarization process to remove excess flowable dielectric layer outside the trench.

20. A method of forming a semiconductor structure comprising:
- depositing a flowable dielectric layer in a trench of a substrate;
- performing a first thermal anneal with an oxygen source;
- performing a second thermal anneal by microwave anneal (MWA); and
- performing a planarization process to remove excess flowable dielectric layer outside the trench,
- wherein the flowable dielectric layer as deposited includes a network of SiONH, and wherein the first thermal anneal and the second thermal anneal convert the as-deposited flowable dielectric layer into silicon dioxide ($SiO_2$).

21. The method of claim 20, wherein the first thermal anneal converts the network of SiONH into a network of SiOH+SiO, and wherein the second thermal anneal converts the network of SiOH+SiO into $SiO_2$.

* * * * *